(12) United States Patent
Yamada

(10) Patent No.: US 6,198,365 B1
(45) Date of Patent: Mar. 6, 2001

(54) FREQUENCY MULTIPLIER CAPABLE OF TAKING OUT EFFICIENTLY AND STABLY HARMONICS HIGHER THAN FOURTH ORDER

(75) Inventor: Atsushi Yamada, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/440,762

(22) Filed: Nov. 16, 1999

(30) Foreign Application Priority Data

Nov. 18, 1998 (JP) .................................................. 10-328197

(51) Int. Cl.⁷ ..................................................... H03H 11/04
(52) U.S. Cl. .......................... 333/218; 327/119; 327/122; 327/123
(58) Field of Search .................................... 327/119, 122, 327/123, 116, 356, 357; 333/218

(56) References Cited

U.S. PATENT DOCUMENTS

| | | | |
|---|---|---|---|
| 4,931,921 | * | 6/1990 | Anderson .............................. 333/218 |
| 5,886,595 | * | 3/1999 | Von Stein ............................. 333/218 |
| 6,066,997 | * | 5/2000 | Matsugatani et al. ................ 333/218 |

FOREIGN PATENT DOCUMENTS 0829953  3/1998  (EP).

OTHER PUBLICATIONS

Shirakawa, Kazuo et al, IEEE 1996 Microwave and Millimeter–Wave Monolithic Circuits Symposium, pp. 35–38. Institute of Electronics, Information and Communication Engineers, pp. 125–127.

Lott, U., "Low–Loss MESFET Frequency Quadrupler From 5 to 20 GHz" Proceedings of the European Microwave Conference, GB, Tunbridge Wells, MEP, vol. Conf. 21, p. 1502–1507 XP000629887 ISBN: 0–946821–37–2, *p. 1502–1503; Figures 1–4.

Patent Abstracts of Japan, vol. 13, No. 005 (E–701), Jan. 9, 1989 & JP 63 217803 A (Matsushita Electric Ind Co Ltd) Sep. 9, 1988.

* cited by examiner

*Primary Examiner*—Tuan T. Lam (57) ABSTRACT

One end of a first transmission line is connected to the collector of an HBT with the base connected to an output terminal of an input-side matching circuit and with the emitter grounded, and one end of an end-open stub for blocking the passage of the doubled wave is connected to the other end of the first transmission line. One end of a second transmission line is connected to the other end of the first transmission line, and one end of an end-open stub for blocking the passage of the fundamental wave is connected to the other end of the second transmission line. An input terminal of an output-side matching circuit is connected to the other end of the second transmission line. The fundamental wave is reflected toward the HBT at the connecting point of the end-open stub for blocking the passage of the fundamental wave, while the doubled wave is reflected toward the HBT at the connecting point of the end-open stub for blocking the passage of the doubled wave, by which only harmonics of quadrupled wave or higher-ordered waves are outputted via the output-side matching circuit. Thus, the frequency multiplier is capable of taking out fourth- or higher-ordered harmonics efficiently with a simple constitution using one high frequency transistor, and can be reduced in size and stabilized in operation.

10 Claims, 4 Drawing Sheets

FREQUENCY MULTIPLIER CAPABLE OF TAKING OUT EFFICIENTLY AND STABLY HARMONICS HIGHER THAN FOURTH ORDER

BACKGROUND OF THE INVENTION

The present invention relates to a frequency multiplier to be used as a high-stability, low-noise signal source for microwave and millimeter-wave communication systems.

As a constitution of the high-stability, low-noise signal source for microwave and millimeter-wave communication systems, there has been provided a technique that with a plurality of frequency multipliers connected in series on the output side of a PLL (phase-locked loop) oscillator that generates low frequency signals, an output frequency of the PLL oscillator is sequentially multiplied to obtain a signal of a desired frequency. In such a PLL oscillator, conventionally, it has been common practice to connect in series frequency multipliers that doubles the frequency.

Figure 7:
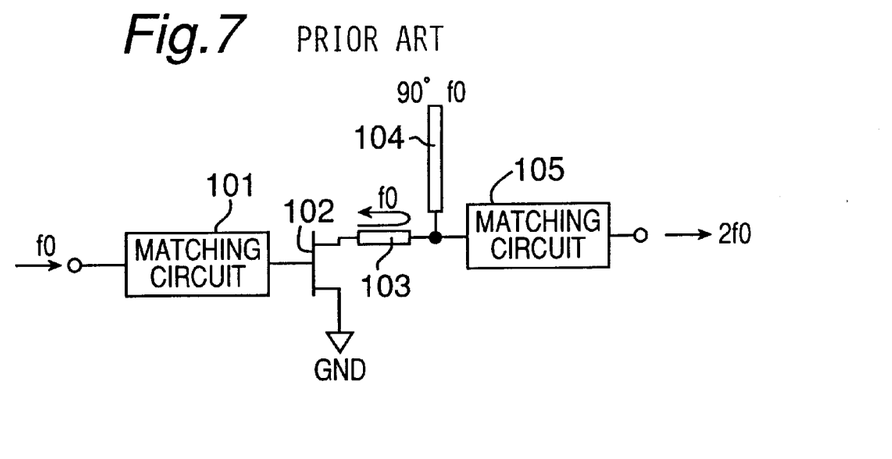
FIG. 7 is a circuit diagram showing a frequency multiplier serving as a doubler according to the prior art.

An example of the frequency multiplier as a doubler is shown in "Monolithic Microwave Integrated Circuits (edited by the Institute of Electronics, Information and Communication Engineers), pp. 125–127". This frequency multiplier, as shown in FIG. 7, comprises an input-side matching circuit 101, an FET (Field Effect Transistor) 102, a transmission line 103, an end-open stub 104, and an output-side matching circuit 105.

In the frequency multiplier of this constitution, with the gate of the FET 102 biased to around the pinch-off, a large-amplitude input signal with frequency f0 is inputted to the gate of the FET 102 via the matching circuit 101. Then, the drain waveform of the FET 102 becomes close to a half-wave rectified one, which has a large portion of frequency components that are integral multiples of the input signal frequency f0, particularly even-ordered frequency components. On the drain side of the FET 102, a fundamental-wave trap circuit employing the end-open stub 104 is used to suppress the fundamental wave. Because the length of the end-open stub 104 is selected so as to be an electrical length of 90° with respect to the fundamental wave of the input signal, the connecting point of the end-open stub 104 is short-circuited to the input signal fundamental wave and appears open to the doubled wave, so that fundamental-wave components are suppressed and the doubled wave is outputted. This frequency multiplier has an additional amplification effect by the FET 102 so that a high-efficiency frequency multiplication can be achieved.

Also, an example of frequency multipliers that quadruple the frequency at one stage with a view to reduction in the number of stages to be connected is shown in "A 15/60 ONE-STAGE MMIC FREQUENCY QUADRUPLER", IEEE, 1996 Microwave and Millimeter-Wave Monolithic Circuits Symposium pp. 35–38".

Figure 8:
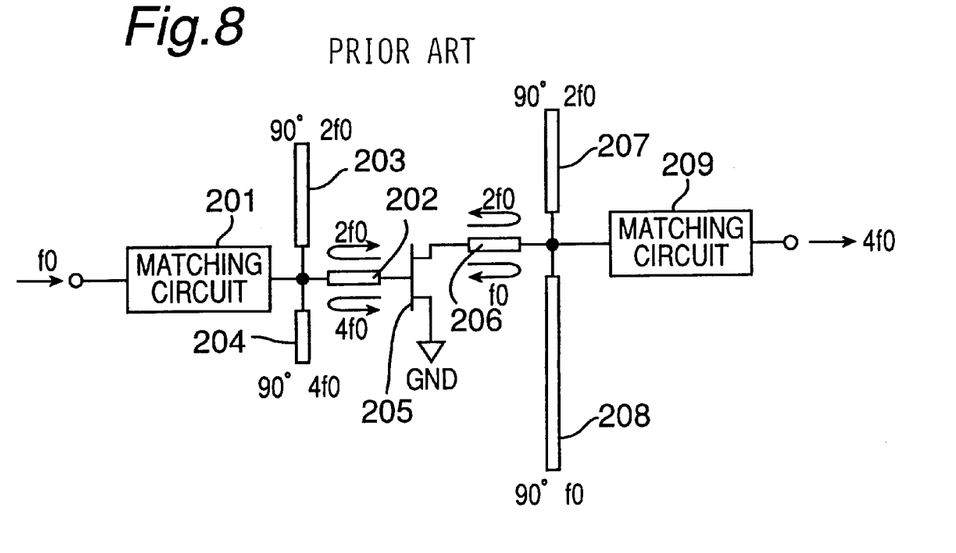
FIG. 8 is a circuit diagram showing a frequency multiplier serving as a quadrupler according to the prior art.

This frequency multiplier as a quadruplet, as shown in FIG. 8, comprises an input-side matching circuit 201, a transmission line 202, an end-open stub 203 having an electrical length of 90° with respect to the doubled wave, an end-open stub 204 having an electrical length of 90° with respect to the quadrupled wave, an HEMT (High Electron Mobility Transistor) 205, a transmission line 206, an end-open stub 207 having an electrical length of 90° with respect to the doubled wave, an end-open stub 208 having an electrical length of 90° with respect to the fundamental wave, and an output-side matching circuit 209. Because the end-open stub 208 having an electrical length of 90° with respect to the fundamental wave and the end-open stub 207 having an electrical length of 90° with respect to the doubled wave are connected to the circuit on the drain side of the HEMT 205, there appears no signals of the fundamental wave (frequency f0) and the doubled wave (frequency 2f0). These end-open stubs are open to the signal of the quadrupled wave (frequency 4f0), so that the signal of the quadrupled wave is outputted. Also, because the end-open stub 203 having an electrical length of 90° with respect to the doubled wave and the end-open stub 204 having an electrical length of 90° with respect to the quadrupled wave are connected to the input side, signals of the doubled wave (frequency 2f0) and the quadrupled wave (frequency 4f0) reflected from the HEMT 205 toward the input side are suppressed.

With regard to the frequency multiplier as a doubler, when frequency multipliers are connected in series in multiple stages to obtain a desired frequency, the number of high-frequency transistors (FETs) increases with increasing number of order of frequency multiplication. This causes problems of increased complexity of the circuit and increased power consumption.

Also, in frequency multipliers as doublers and frequency multipliers as quadruplers, at voltages higher than the pinch-off, the drain current of the FETs (including HEMTs) generally exhibits a square characteristic to the gate voltage. This causes a problem of poor efficiency at the time when harmonics of tripled wave or higher-ordered waves are taken out.

Therefore, an object of the present invention is to provide a frequency multiplier which is capable of taking out fourth- or higher-ordered harmonics efficiently with a simple constitution using one high frequency transistor, and which can be reduced in size and stabilized in operation.

In order to achieve the aforementioned object, there is provided a frequency multiplier comprising:

an input-side matching circuit;

a high frequency transistor with base or gate connected to an output terminal of the input-side matching circuit and with emitter or source grounded;

first signal transmission means with one end connected to collector or drain of the high frequency transistor;

doubled-wave reflection means with one end connected to the other end of the first signal transmission means;

second signal transmission means with one end connected to the other end of the first signal transmission means;

fundamental-wave reflection means with one end connected to the other end of the second signal transmission means; and an output-side matching circuit with its input terminal connected to the other end of the second signal transmission means.

In an embodiment of the present invention, the first signal transmission means is a first transmission line;

the second signal transmission means is a second transmission line;

the doubled-wave reflection means is an end-open stub for blocking passage of a doubled wave; and the fundamental-wave reflection means is an end-open stub for blocking passage of a fundamental wave.

According to this frequency multiplier, when an input signal is inputted to the base of the high frequency transistor (e.g., bipolar transistor) via the input-side matching circuit, the collector current of the high frequency transistor increases exponentially relative to the base voltage, so that many harmonics are outputted. Then, because a short-circuit to the fundamental wave is formed at the connecting point of the end-open stub for blocking the passage of the fundamental wave, the fundamental wave is reflected toward the high frequency transistor. Also, because a short-circuit to the doubled wave is formed at the connecting point of the end-open stub for blocking the passage of the doubled wave, the doubled wave is reflected toward the high frequency transistor. Thus, only harmonics of quadrupled wave or higher-ordered waves are outputted via the output-side matching circuit. When this occurs, the fundamental wave is reflected toward the high frequency transistor by the end-open stub for blocking the passage of the fundamental wave, so that the output power of the doubled wave is increased by the multiplying effect of the high frequency transistor. The doubled wave of increased output power is further reflected toward the high frequency transistor by the end-open stub for blocking the passage of the doubled wave, so that the output power of the quadrupled wave is further increased by the multiplying effect of the high frequency transistor. Also, in order that the fundamental wave is converted to the doubled wave to a maximum while the doubled wave is converted to the quadrupled wave to a maximum, the electrical lengths of the first transmission line and the second transmission line are optimized to, for example, about 10–40° with respect to the fundamental wave, by which the output efficiency of the quadrupled wave is increased. Further, by appropriately setting the characteristic impedances of the end-open stub for blocking the passage of the doubled wave and the end-open stub for blocking the passage of the fundamental wave to, for example, about 20–70 Ω, the doubled wave can be effectively suppressed without narrowing the frequency band of the quadrupled wave. Thus, the frequency multiplier is capable of taking out fourth- or higher-ordered harmonics efficiently with a simple constitution using one high frequency transistor, particularly taking out the quadrupled wave with high output efficiency. In addition, similar effects can be obtained also by using as the high frequency transistor a MESFET (MEtal Semiconductor Field Effect Transistor) or HEMT (High Electron Mobility Transistor) or the like.

In an embodiment of the present invention, the first signal transmission means is a first inductor;

the second signal transmission means is a second inductor;

the doubled-wave reflection means is a circuit generally equivalent to an end-open stub for blocking passage of a doubled wave, the circuit being an equivalent circuit for blocking passage of the doubled wave and being constituted by a concentrated constant circuit using an inductor and a capacitor; and the fundamental-wave reflection means is a circuit generally equivalent to an end-open stub for blocking passage of a fundamental wave, the circuit being an equivalent circuit for blocking passage of the fundamental wave and being constituted by a concentrated constant circuit using an inductor and a capacitor.

According to this frequency multiplier, when an input signal is inputted to the base of the high frequency transistor (e.g., bipolar transistor) via the input-side matching circuit, the collector current of the high frequency transistor increases exponentially relative to the base voltage, so that many harmonics are outputted. Then, because a short-circuit to the fundamental wave is formed at the connecting point of the equivalent circuit for blocking the passage of the fundamental wave, the fundamental wave is reflected toward the high frequency transistor. Also, because a short-circuit to the doubled wave is formed at the connecting point of the equivalent circuit for blocking the passage of the doubled wave, the doubled wave is reflected toward the high frequency transistor. Thus, only harmonics of quadrupled wave or higher-ordered waves are outputted via the output-side matching circuit. When this occurs, the fundamental wave is reflected toward the high frequency transistor by the equivalent circuit for blocking the passage of the fundamental wave, so that the output power of the doubled wave is increased by the multiplying effect of the high frequency transistor. The doubled wave of increased output power is further reflected toward the high frequency transistor by the equivalent circuit for blocking the passage of the doubled wave, so that the output power of the quadrupled wave is further increased by the multiplying effect of the high frequency transistor. Also, in order that the fundamental wave is converted to the doubled wave to a maximum while the doubled wave is converted to the quadrupled wave to a maximum, the reactances of the first inductor and the second inductor are optimized, by which the output efficiency of the quadrupled wave is increased. Thus, the frequency multiplier is capable of taking out fourth- or higher-ordered harmonics efficiently with a simple constitution using one high frequency transistor, particularly taking out the quadrupled wave with high output efficiency. Furthermore, when the inductors are implemented by chip inductors or spiral inductors and the capacitors are implemented by chip capacitors or MIM capacitors, and when the distributed constant circuits of the end-open stubs are replaced with concentrated constant circuits using inductors and capacitors, the circuit occupancy area can be reduced. In this case, in particular, effects can be obtained when an MMIC is implemented by using spiral inductors and MIM capacitors. In addition, similar effects can be obtained also by using as the high frequency transistor a MESFET or HEMT or the like.

In an embodiment of the present invention, the emitter or the source of the high frequency transistor is grounded via a transmission line.

According to this frequency multiplier, by inserting a transmission line between the emitter (or source) of the high frequency transistor and the ground, the reflection coefficient on the input side of the high frequency transistor can be reduced, so that the input-side matching can be easily attained without significantly losing the multiplication gain. As a result of this, the reflection characteristics at the input end of this frequency multiplier can be improved and the circuit operation can be stabilized. It is noted that the electrical length of the transmission line is preferably 1–15° with respect to the fundamental wave.

In an embodiment of the present invention, the emitter or the source of the high frequency transistor is grounded via an inductor.

According to this frequency multiplier, by inserting an inductor between the emitter (or source) of the high frequency transistor and the ground, the reflection coefficient on the input side of the high frequency transistor can be reduced, so that the input-side matching can be easily attained without significantly losing the multiplication gain. As a result of this, the reflection characteristics at the input end of this frequency multiplier can be improved and the circuit operation can be stabilized. It is noted that the reactance of the inductor is preferably 1–10 Ω with respect to the fundamental wave.

In an embodiment of the present invention, the high frequency transistor is a heterojunction bipolar transistor.

According to this frequency multiplier, in a comparison between the harmonic output characteristics of the HBT (Heterojunction Bipolar Transistor) and another high frequency transistor, for example, an HEMT, which are operated at around the pinch-off, the difference between fundamental wave and doubled wave is similar in level to each other, whereas the output power ratio of third- or higher-ordered harmonics is higher in the HBT than the HEMT. Thus, the output power of harmonics can be increased by employing the HBT as the high frequency transistor.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, the frequency multiplier of the present invention is described in detail by embodiments thereof illustrated in the accompanying drawings.

(First Embodiment)

Figure 1:
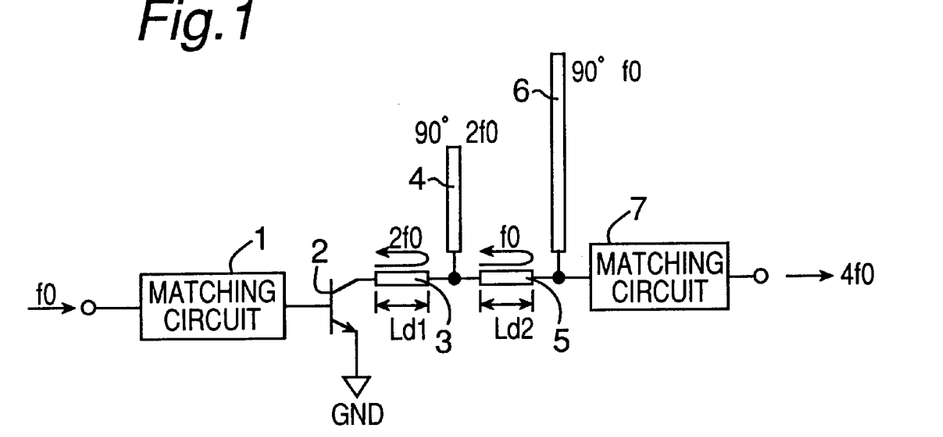
FIG. 1 is a circuit diagram of a frequency multiplier according to a first embodiment of the present invention.

FIG. 1 is a circuit diagram of a frequency multiplier according to a first embodiment of the present invention. Reference numeral 1 denotes an input-side matching circuit to which an input signal with frequency f0 is inputted, 2 denotes an HBT (Heterojunction Bipolar Transistor) in which an output terminal of the input-side matching circuit 1 is connected to the base, and in which the emitter is connected to the ground GND, 3 denotes a first transmission line with one end connected to the collector of the HBT 2, 4 denotes an end-open stub for blocking the passage of the doubled wave, one end of the end-open stub 4 being connected to the other end of the first transmission line 3, and the electrical length of the end-open stub 4 being 90° with respect to the doubled wave, 5 denotes a second transmission line with one end connected to the other end of the first transmission line 3, 6 denotes an end-open stub for blocking the passage of the fundamental wave, one end of the end-open stub 6 being connected to the other end of the second transmission line 5, and the electrical length of the end-open stub 6 being 90° with respect to the fundamental wave, and 7 denotes an output-side matching circuit with its input terminal connected to the other end of the second transmission line 5. The input-side matching circuit 1 serves for matching on the input side of the HBT 2 at the fundamental wave frequency f0, and the output-side matching circuit 7 serves for matching on the output side of the HBT 2 at the quadrupled wave frequency 4f0. The matching circuits 1, 7 serve also as bias circuits, where the bias is set so that the HBT 2 operates at around the pinch-off.

In the frequency multiplier of this constitution, an input signal with frequency f0 is inputted to the base of the HBT 2 via the input-side matching circuit 1. Because the collector current of the HBT 2 increases exponentially relative to the base voltage, many harmonics are outputted. Then, the connecting point of the end-open stub 6 for blocking the passage of the fundamental wave with the electrical length of 90° to the fundamental wave (frequency f0) is short-circuited to the fundamental wave (frequency f0), so that the fundamental wave is reflected toward the HBT 2. Also, the connecting point of the end-open stub 4 for blocking the passage of the doubled wave with the electrical length of 90° to the doubled wave (frequency 2f0) is short-circuited to the doubled wave, so that the doubled wave is reflected toward the HBT 2. Thus, only fourth- or higher-ordered harmonics are outputted via the matching circuit 7.

When the characteristic impedance $Zc1$ of the end-open stub 6 for blocking the passage of the fundamental wave and the characteristic impedance $Zc2$ of the end-open stub 4 for blocking the passage of the doubled wave are small, the frequency band becomes wider but the suppression ratio of the fundamental wave (frequency f0) and the doubled wave (frequency 2f0) becomes smaller. On the other hand, when the characteristic impedances $Zc1$ and $Zc2$ are large, the suppression ratio of the fundamental wave (frequency f0) and the doubled wave (frequency 2f0) becomes larger but the frequency band becomes narrower. That is, the suppression of the doubled wave (frequency 2f0) and the frequency band are in a trade-off relation, and normally the characteristic impedances $Zc1$ and $zc2$ are selected within a range of 20–70 Ω.

Also, because the fundamental wave is reflected toward the HBT 2 by the end-open stub 6 for blocking the passage of the fundamental wave with the electrical length of 90° to the fundamental wave (frequency f0), the output power of the doubled wave (frequency 2f0) is increased by the multiplying effect of the HBT 2. The doubled wave of increased output power is reflected toward the HBT 2 by the end-open stub 4 for blocking the passage of the doubled wave with the electrical length of 90° to the doubled wave, so that the output power of the quadrupled wave is further increased by the multiplying effect of the HBT 2. Furthermore, there exist an optimum length total ($Ld1+Ld2$) of the transmission line 3 and the transmission line 5 for converting the fundamental wave to the doubled wave to a maximum, as well as an optimum length $Ld1$ of the transmission line 3 for converting the doubled wave to the quadrupled wave to a maximum. By independently optimizing the points at which the fundamental wave and the doubled wave are reflected with those two transmission lines 3, 5, respectively, the output efficiency of the quadrupled wave is enhanced.

In addition, although the optimum lengths of the two transmission lines 3, 5 vary depending on the frequency or the HBT used, the output power of the quadrupled wave becomes a maximum at their electrical lengths of 10–40° to the fundamental wave, respectively. Further, the end-open stub 4 for blocking the passage of the doubled wave, the end-open stub 6 for blocking the passage of the fundamental wave and the transmission lines 3, 5 are implemented by microstrip lines or coplanar lines or the like.

Like this, this frequency multiplier is capable of taking out fourth- or higher-ordered harmonics with a simple constitution using one HBT and, in particular, taking out the quadrupled wave with high output efficiency.

Whereas the drain current of an FET used for conventional frequency multipliers exhibits a square characteristic to the gate voltage, the collector current of the HBT used in this first embodiment increases exponentially relative to the base voltage. Accordingly, when the HBT is operated at around the pinch-off, the output power of third- or higher-ordered harmonics becomes larger as compared with the FET.

Figure 5:
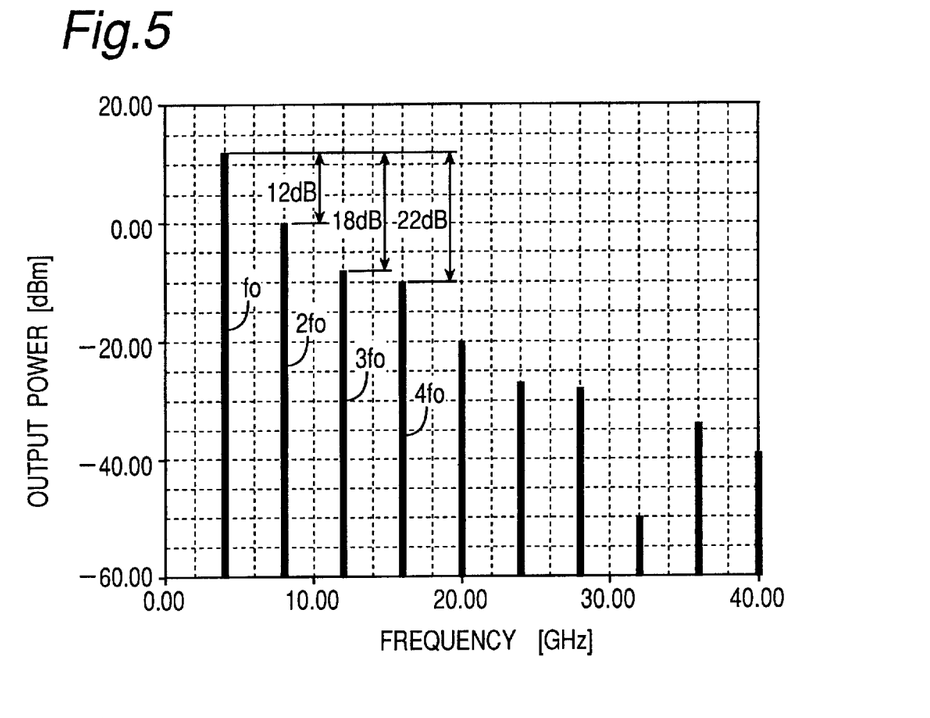
FIG. 5 is a chart showing harmonic output characteristics at the pinch-off of the HBT.
Figure 6:
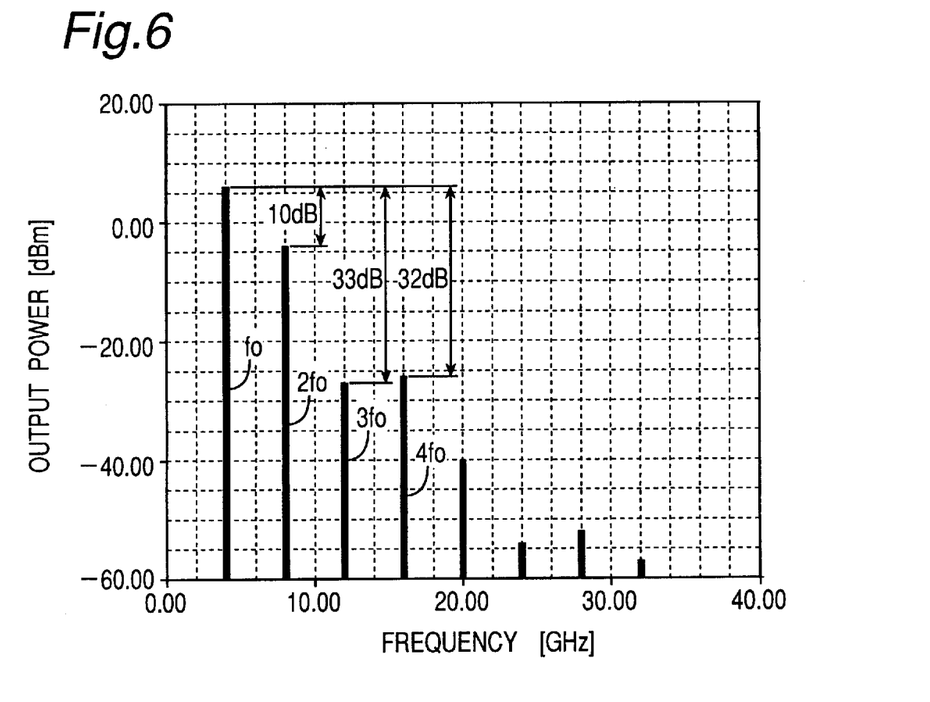
FIG. 6 is a chart showing harmonic output characteristics at the pinch-off of the HEMT.

Also, FIG. 5 shows harmonic output characteristics at the pinch-off of the HBT, and FIG. 6 shows harmonic output characteristics at the pinch-off of the HEMT. Both HBT and HEMT are devices having a maximum frequency fmax of 60–70 GHz and a rated current of about 40 mA. As shown in FIGS. 5 and 6, in a comparison of output harmonics between the HBT and the HEMT, which are operated at around the pinch-off, it can be seen that while the difference between fundamental wave and doubled wave is about 10 dB in either case of HBT and HEMT, the difference between fundamental wave and tripled wave is 33 dB in HEMT and 18 dB in HBT and the difference between fundamental wave and quadrupled wave is 32 dB in HEMT and 22 dB in HBT, so that the output power ratio of third- or higher-ordered harmonics is 10 dB or more higher in the HBT than in the HEMT. Accordingly, employing the HBT as the high frequency transistor makes it possible to increase the output power of harmonics.

(Second Embodiment)

Figure 2:
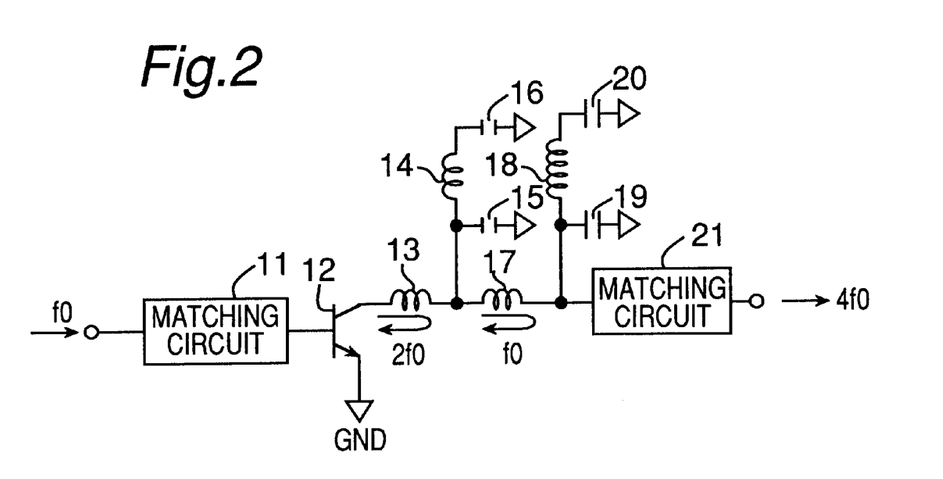
FIG. 2 is a circuit diagram of a frequency multiplier according to a second embodiment of the present invention.

FIG. 2 is a circuit diagram of a frequency multiplier according to a second embodiment of the present invention. Reference numeral 11 denotes an input-side matching circuit to which an input signal with frequency f0 is inputted, 12 denotes an HBT in which an output terminal of the input-side matching circuit 11 is connected to the base, and in which the emitter is connected to the ground GND, 13 denotes a first inductor with one end connected to the collector of the HBT 12, 14 denotes an inductor with one end connected to the other end of the first inductor 13, 15 denotes a capacitor connected between one end of the inductor 14 and the ground GND, 16 denotes a capacitor connected between the other end of the inductor 14 and the ground GND, 17 denotes a second inductor with one end connected to the other end of the first inductor 13, 18 denotes an inductor with one end connected to the other end of the inductor 17, 19 denotes a capacitor connected between one end of the inductor 18 and the ground GND, 20 denotes a capacitor connected between the other end of the inductor 18 and the ground GND, and 21 denotes an output-side matching circuit with its input terminal connected to the other end of the second inductor 17. The input-side matching circuit 11 serves for matching on the input side of the HBT 12 at the fundamental wave frequency f0, and the output-side matching circuit 21 serves for matching on the output side of the HBT 12 at the quadrupled wave frequency 4f0. The matching circuits 11, 21 serve also as bias circuits, where the bias is set so that the HBT 12 operates at around the pinch-off.

In this frequency multiplier, instead of the end-open stub 6 for blocking the passage of the fundamental wave shown in FIG. 1 in the first embodiment, an equivalent circuit for blocking the passage of the fundamental wave, in which the end-open stub 6 for blocking the passage of the fundamental wave has been converted into a concentrated constant circuit being constituted by the inductor 18, the capacitor 19 and the capacitor 20. Also, instead of the end-open stub 4 for blocking the passage of the doubled wave shown in FIG. 1 in the first embodiment, an equivalent circuit for blocking the passage of the doubled wave, in which the end-open stub 4 for blocking the passage of the doubled wave has been converted into a concentrated constant circuit being constituted by the inductor 14, the capacitor 15 and the capacitor 16.

Assuming that, in FIG. 1, the characteristic impedance of the end-open stub 6 for blocking the passage of the fundamental wave is Zc1 and the characteristic impedance of the end-open stub 4 for blocking the passage of the doubled wave is Zc2, and that, in FIG. 2, the inductances of the inductors 18, 14 are L1, L2, respectively, the capacitance of the capacitors 19, 20 is C1 and the capacitance of the capacitors 15, 16 is C2, then setting that $$L1 = Zc1/(2\pi f0)$$

$$C1 = 1/(2\pi f0 \cdot Zc1)$$

makes it possible to replace the end-open stub 6 for blocking the passage of the fundamental wave in FIG. 1 by an equivalent circuit for blocking the passage of the fundamental wave employing inductors and capacitors. Besides, setting that $$L2 = Zc2/(4\pi f0)$$

$$C2 = 1/(4\pi f0 \cdot Zc2)$$

makes it possible to replace the end-open stub 4 for blocking the passage of the doubled wave in FIG. 1 by an equivalent circuit for blocking the passage of the doubled wave employing inductors and capacitors.

Further, in this frequency multiplier, the first inductor 13 is used instead of the first transmission line 3 of FIG. 1, and the second inductor 17 is used instead of the second transmission line 5 of FIG. 1. Although the optimum reactance of the first, second inductors 13, 17 varies depending on the frequency or the HBT used, the output power of the quadrupled wave becomes a maximum when the reactance of the first inductor 13 is 10–40 Ω with respect to the fundamental wave and the reactance of the second inductor 17 is 10–40 Ω with respect to the fundamental wave.

Accordingly, the frequency multiplier of this second embodiment has the same effects as the frequency multiplier of the first embodiment.

Referring to FIG. 2, when the inductors 13, 14, 17, 18 are implemented by chip inductors or spiral inductors and the capacitors 15, 16, 19, 20 are implemented by chip capacitors or MIM (Metal Insulator Metal) capacitors, and when the distributed constant circuits of the end-open stubs are replaced with concentrated constant circuits using inductors and capacitors, the circuit occupancy area can be reduced. In particular, it is effective that an MMIC (Monolithic Microwave Integrated Circuit) is implemented by using spiral inductors and MIM capacitors. In addition, the replacement of the distributed constant circuits of the end-open stub 6 for blocking the passage of the fundamental wave and the end-open stub 4 for blocking the passage of the doubled wave with the concentrated constant circuits is effective for circuits of up to about 10 GHz.

(Third Embodiment)

Figure 3:
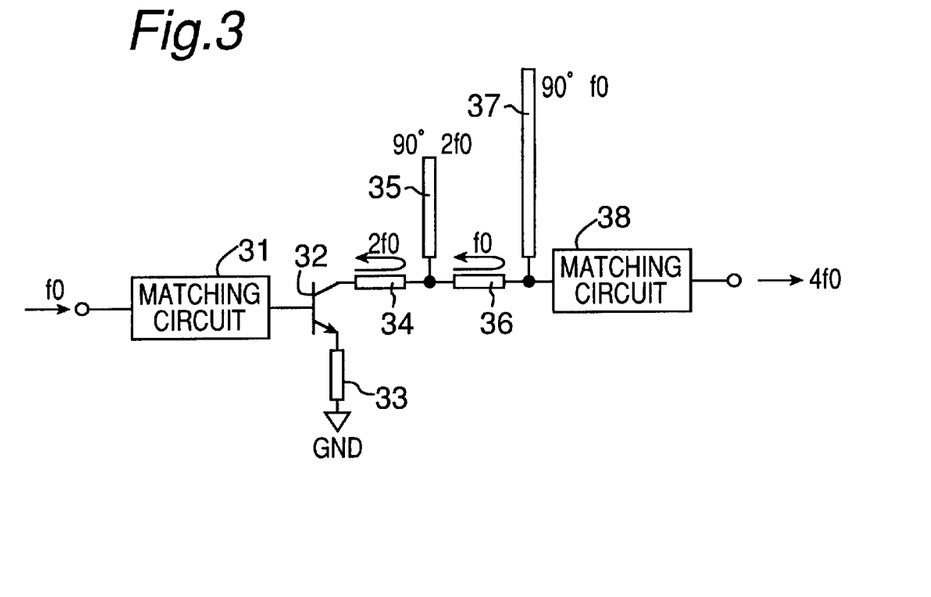
FIG. 3 is a circuit diagram of a frequency multiplier according to a third embodiment of the present invention.

FIG. 3 is a circuit diagram of a frequency multiplier according to a third embodiment of the present invention. Reference numeral 31 denotes an input-side matching circuit to which an input signal with frequency f0 is inputted, 32 denotes an HBT in which an output terminal of the input-side matching circuit 31 is connected to, the base, 33 denotes a transmission line for connecting the emitter of the HBT 32 and the ground GND to each other, 34 denotes a first transmission line with one end connected to the collector of the HBT 32, 35 denotes an end-open stub for blocking the passage of the doubled wave, one end of the end-open stub 35 being connected to the other end of the first transmission line 34, and the electrical length of the end-open stub 35 being 90° with respect to the doubled wave, 36 denotes a second transmission line with one end connected to the other end of the first transmission line 34, 37 denotes an end-open stub for blocking the passage of the fundamental wave, one end of the end-open stub 37 being connected to the other end of the second transmission line 36, and the electrical length of the end-open stub 37 being 90° with respect to the fundamental wave, and 38 denotes an output-side matching circuit with its input terminal connected to the other end of the second transmission line 36. The input-side matching circuit 31 serves for matching on the input side of the HBT 32 at the fundamental wave frequency f0, and the output-side matching circuit 38 serves for matching on the output side of the HBT 32 at the quadrupled wave frequency 4f0. The matching circuits 31, 38 serve also as bias circuits, where the bias is set so that the HBT 32 operates at around the pinch-off.

The frequency multiplier of this constitution is similar in constitution to the frequency multiplier of the first embodiment except the transmission line 33 inserted between the emitter of the HBT 32 and the ground GND. Accordingly, the frequency multiplier of this third embodiment has the same effects as the frequency multiplier of the first embodiment.

The first embodiment has a problem that when the lengths of the transmission lines 3, 5 shown in FIG. 1 are optimized so that a maximum multiplication gain is obtained, the reflection coefficient on the input side of the HBT 2 becomes so large that input-side matching is often difficult to obtain, and that the reflection coefficient becomes 1 or more, causing occurrence of oscillation. Thus, in this third embodiment, by inserting the transmission line 33 between the emitter of the HBT 32 and the ground GND, the reflection coefficient on the input side of the HBT 32 can be reduced so that the input-side matching can be easily attained without significantly losing the multiplication gain. As a result of this, the reflection characteristics at the input end of this frequency multiplier can be improved and the circuit operation can be stabilized. It is noted that the transmission line 33 is set to an electrical length of about 10° with respect to the fundamental wave, i.e., an electrical length of 5–15°.

(Fourth Embodiment)

Figure 4:
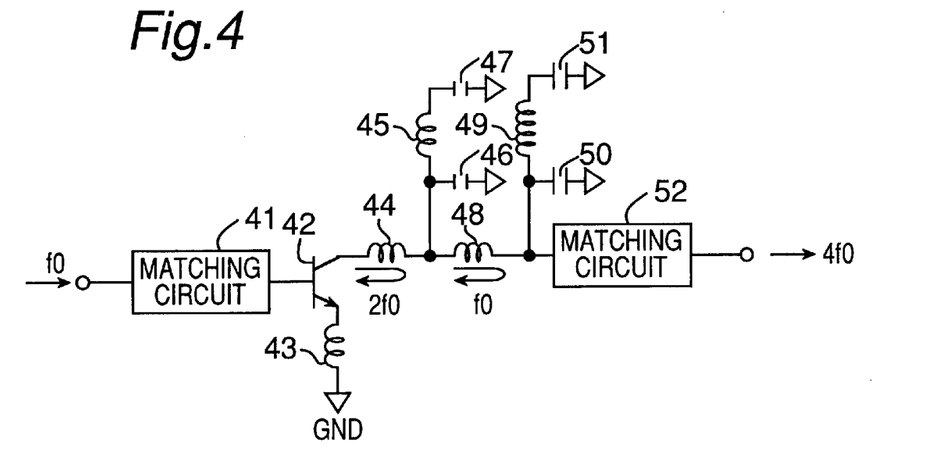
FIG. 4 is a circuit diagram of a frequency multiplier according to a fourth embodiment of the present invention.

FIG. 4 is a circuit diagram of a frequency multiplier according to a fourth embodiment of the present invention. Reference numeral 41 denotes an input-side matching circuit to which an input signal with frequency f0 is inputted, 42 denotes an HBT in which an output terminal of the input-side matching circuit 41 is connected to the base, 43 denotes an inductor for connecting the emitter of the HBT 42 and the ground GND to each other, 44 denotes a first inductor with one end connected to the collector of the HBT 42, 45 denotes an inductor with one end connected to the other end of the first inductor 44, 46 denotes a capacitor connected between one end of the inductor 45 and the ground GND, 47 denotes a capacitor connected between the other end of the inductor 45 and the ground GND, 48 denotes a second inductor with one end connected to the other end of the first inductor 44, 49 denotes an inductor with one end connected to the other end of the inductor 48, 50 denotes a capacitor connected between one end of the inductor 49 and the ground GND, 51 denotes a capacitor connected between the other end of the inductor 49 and the ground GND, and 52 denotes an output-side matching circuit with its input terminal connected to the other end of the inductor 48. The input-side matching circuit 41 serves for matching on the input side of the HBT 42 at the fundamental wave frequency f0, and the output-side matching circuit 52 serves for matching on the output side of the HBT 42 at the quadrupled wave frequency 4f0. The matching circuits 41, 52 serve also as bias circuits, where the bias is set so that the HBT 42 operates at around the pinch-off.

In this frequency multiplier, instead of the end-open stub 6 for blocking the passage of the fundamental wave shown in FIG. 1 in the first embodiment, an equivalent circuit for blocking the passage of the fundamental wave, in which the end-open stub 6 for blocking the passage of the fundamental wave has been converted into a concentrated constant circuit being constituted by the inductor 49, the capacitor 50 and the capacitor 51. Also, instead of the end-open stub 4 for blocking the passage of the doubled wave shown in FIG. 1 in the first embodiment, an equivalent circuit for blocking the passage of the doubled wave, in which the end-open stub 4 for blocking the passage of the doubled wave has been converted into a concentrated constant circuit being constituted by the inductor 45, the capacitor 46 and the capacitor 47.

The frequency multiplier of this constitution is similar in constitution to the frequency multiplier of the second embodiment except the inductor 43 inserted between the emitter of the HBT 42 and the ground GND. Accordingly, the frequency multiplier of this fourth embodiment has the same effects as the frequency multiplier of the second embodiment.

Also, by the inductor 43 inserted between the emitter of the HBT 42 and the ground GND, the reflection coefficient on the input side of the HBT 42 can be reduced, so that the input-side matching can be easily attained without significantly losing the multiplication gain. As a result of this, the reflection characteristics at the input end of this frequency multiplier can be improved and the circuit operation can be stabilized. It is noted that the inductor 43 is set to about a few $\Omega$ with respect to the fundamental wave, i.e., 1–10 $\Omega$.

Although an HBT has been employed as the high frequency transistor in the above first to fourth embodiments, it is also effective to constitute the frequency multiplier of the present invention by using a MESFET (MEtal Semiconductor Field Effect Transistor) or HEMT.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A frequency multiplier comprising:

an input-side matching circuit;

a high frequency transistor with base or gate connected to an output terminal of the input-side matching circuit and with emitter or source grounded;

first signal transmission means with one end connected to collector or drain of the high frequency transistor;

doubled-wave reflection means with one end connected to the other end of the first signal transmission means;

second signal transmission means with one end connected to the other end of the first signal transmission means;

fundamental-wave reflection means with one end connected to the other end of the second signal transmission means; and an output-side matching circuit with its input terminal connected to the other end of the second signal transmission means.

2. The frequency multiplier according to claim 1, wherein:

the first signal transmission means is a first transmission line;

the second signal transmission means is a second transmission line;

the doubled-wave reflection means is an end-open stub for blocking passage of a doubled wave; and the fundamental-wave reflection means is an end-open stub for blocking passage of a fundamental wave.

3. The frequency multiplier according to claim 2, wherein:

both the end-open stub for blocking passage of the doubled wave and the end-open stub for blocking passage of the fundamental wave have a characteristic impedance of 20–70 Ω; and both the first transmission line and the second transmission line have an electrical length of 10–40° with respect to the fundamental wave.

4. The frequency multiplier according to claim 1, wherein:

the first signal transmission means is a first inductor;

the second signal transmission means is a second inductor;

the doubled-wave reflection means is a circuit generally equivalent to an end-open stub for blocking passage of a doubled wave, the circuit being an equivalent circuit for blocking passage of the doubled wave and being constituted by a concentrated constant circuit using an inductor and a capacitor; and the fundamental-wave reflection means is a circuit generally equivalent to an end-open stub for blocking passage of a fundamental wave, the circuit being an equivalent circuit for blocking passage of the fundamental wave and being constituted by a concentrated constant circuit using an inductor and a capacitor.

5. The frequency multiplier according to claim 4, wherein:

the first inductor has a reactance of 10–40 Ω with respect to the fundamental wave; and the second inductor has a reactance of 2–10 Ω with respect to the fundamental wave.

6. The frequency multiplier according to claim 1, wherein the emitter or the source of the high frequency transistor is grounded via a transmission line.

7. The frequency multiplier according to claim 6, wherein the transmission line has an electrical length of 5–15° with respect to the fundamental wave.

8. The frequency multiplier according to claim 1, wherein the emitter or the source of the high frequency transistor is grounded via an inductor.

9. The frequency multiplier according to claim 8, wherein the inductor has a reactance of 1–10 Ω with respect to the fundamental wave.

10. The frequency multiplier according to claim 1, wherein the high frequency transistor is a heterojunction bipolar transistor.

* * * * *